US012164401B2

(12) United States Patent
Singh et al.

(10) Patent No.: US 12,164,401 B2
(45) Date of Patent: Dec. 10, 2024

(54) METHOD AND APPARATUS TO INJECT ERRORS IN A MEMORY BLOCK AND VALIDATE DIAGNOSTIC ACTIONS FOR MEMORY BUILT-IN-SELF-TEST (MBIST) FAILURES

(71) Applicant: NXP B.V., Eindhoven (NL)

(72) Inventors: Umesh Pratap Singh, Hodal (IN); Ajay Sharma, New Delhi (IN); Ruchi Bora, Lucknow (IN); Ashish Goel, Noida (IN)

(73) Assignee: NXP B.V., Eindhoven (NL)

( * ) Notice: Subject to any disclaimer, the term of this patent is extended or adjusted under 35 U.S.C. 154(b) by 35 days.

(21) Appl. No.: 18/318,840

(22) Filed: May 17, 2023

(65) Prior Publication Data
US 2024/0320112 A1 Sep. 26, 2024

(30) Foreign Application Priority Data
Mar. 22, 2023 (IN) .............................. 202341020106

(51) Int. Cl.
| | |
|---|---|
| *G06F 11/27* | (2006.01) |
| *G01R 31/317* | (2006.01) |
| *G01R 31/3185* | (2006.01) |
| *G06F 11/263* | (2006.01) |

(52) U.S. Cl.
CPC ........ *G06F 11/27* (2013.01); *G01R 31/31703* (2013.01); *G01R 31/318566* (2013.01); *G06F 11/263* (2013.01)

(58) Field of Classification Search
CPC . G06F 11/27; G06F 11/263; G01R 31/31703; G01R 31/318566

USPC .......................................... 714/718, 719, 703
See application file for complete search history.

(56) References Cited

U.S. PATENT DOCUMENTS

| | | | |
|---|---|---|---|
| 4,916,388 A | 4/1990 | Sano | |
| 7,689,866 B2* | 3/2010 | Chakraborty | ....... G06F 11/3672 714/32 |
| 7,941,772 B2 | 5/2011 | Bueti et al. | |
| 8,595,557 B2 | 11/2013 | Jasinski et al. | |
| 10,593,419 B1 | 3/2020 | Gregor et al. | |
| 10,910,082 B1* | 2/2021 | Becker | ................ G06F 11/1048 |
| 10,928,449 B2* | 2/2021 | Azam | ................ G01R 31/3187 |

(Continued)

OTHER PUBLICATIONS

Schönfelder, Fies: A Fault Injection Framework for the Evaluation of Self-Tests, Jan. 2015, Graz University of Technology, pp. 1-116. (Year: 2015).*

(Continued)

*Primary Examiner* — John J Tabone, Jr.

(57) ABSTRACT

A memory built in self test (MBIST) controller of an MBIST circuit outputs first data. One or more errors is injected in the first data to produce second data. The second data is stored in the memory block. The memory block outputs the second data stored in the memory block. The MBIST controller receives the second data and detects an error in the second data based on a comparison with the first data, the error indicative of a failure of the MBIST. The MBIST controller provides an indication of failure of the MBIST to a processing core external to the MBIST circuit which performs diagnostic action in response to receiving the indication of failure of the MBIST. The processing core validates implementation of the diagnostic action.

20 Claims, 7 Drawing Sheets

(56) References Cited

U.S. PATENT DOCUMENTS

| 11,335,428 B2* | 5/2022 | Azam | G11C 29/36 |
| 2014/0217406 A1* | 8/2014 | Thomas | G11C 29/44 |
| | | | 257/48 |
| 2017/0249224 A1* | 8/2017 | Suzuki | G06F 11/27 |
| 2018/0174665 A1* | 6/2018 | Kraipak | G11C 29/36 |
| 2019/0051370 A1* | 2/2019 | Azam | G11C 29/36 |
| 2019/0227121 A1* | 7/2019 | Azam | G06F 11/073 |
| 2024/0160545 A1* | 5/2024 | Srivastava | H04L 9/0894 |

OTHER PUBLICATIONS

Chang et al., Evaluating and Accelerating High-Fidelity Error Injection for HPC, 2018, IEEE, pp. 1-13. (Year: 2018).*

* cited by examiner

METHOD AND APPARATUS TO INJECT ERRORS IN A MEMORY BLOCK AND VALIDATE DIAGNOSTIC ACTIONS FOR MEMORY BUILT-IN-SELF-TEST (MBIST) FAILURES

CROSS-REFERENCE TO RELATED APPLICATIONS

This application claims the priority under 35 U.S.C. § 119 of India patent application no. 202341020106, filed on 22 Mar. 2023, the contents of which are incorporated by reference herein.

FIELD OF USE

This disclosure generally relates to built-in-self test (BIST), and more particularly to injecting errors in a memory block and validating diagnostic actions for memory BIST (MBIST) failures.

BACKGROUND

Memory built-in-self test (MBIST) is used to test operation of a memory block such as a semiconductor memory and in particular detect whether data stored in the memory block is different from data retrieved from the memory block. A difference between the stored and retrieved data indicates a storage fault in the memory block which could be caused by aging or silicon degradation of the memory block. A diagnostic action is typically performed in response to the failure of the MBIST to remedy the storage fault. A system integrator which integrates the memory block into an electronic system usually develops diagnostic action software to implement the diagnostic action but is not able to validate proper operation of the diagnostic action software unless the memory block is actually defective. Since the system integrator does not usually have access to a defective memory block when the diagnostic action software is developed, the diagnostic action software to perform the diagnostic action cannot be fully validated.

Figure 1:
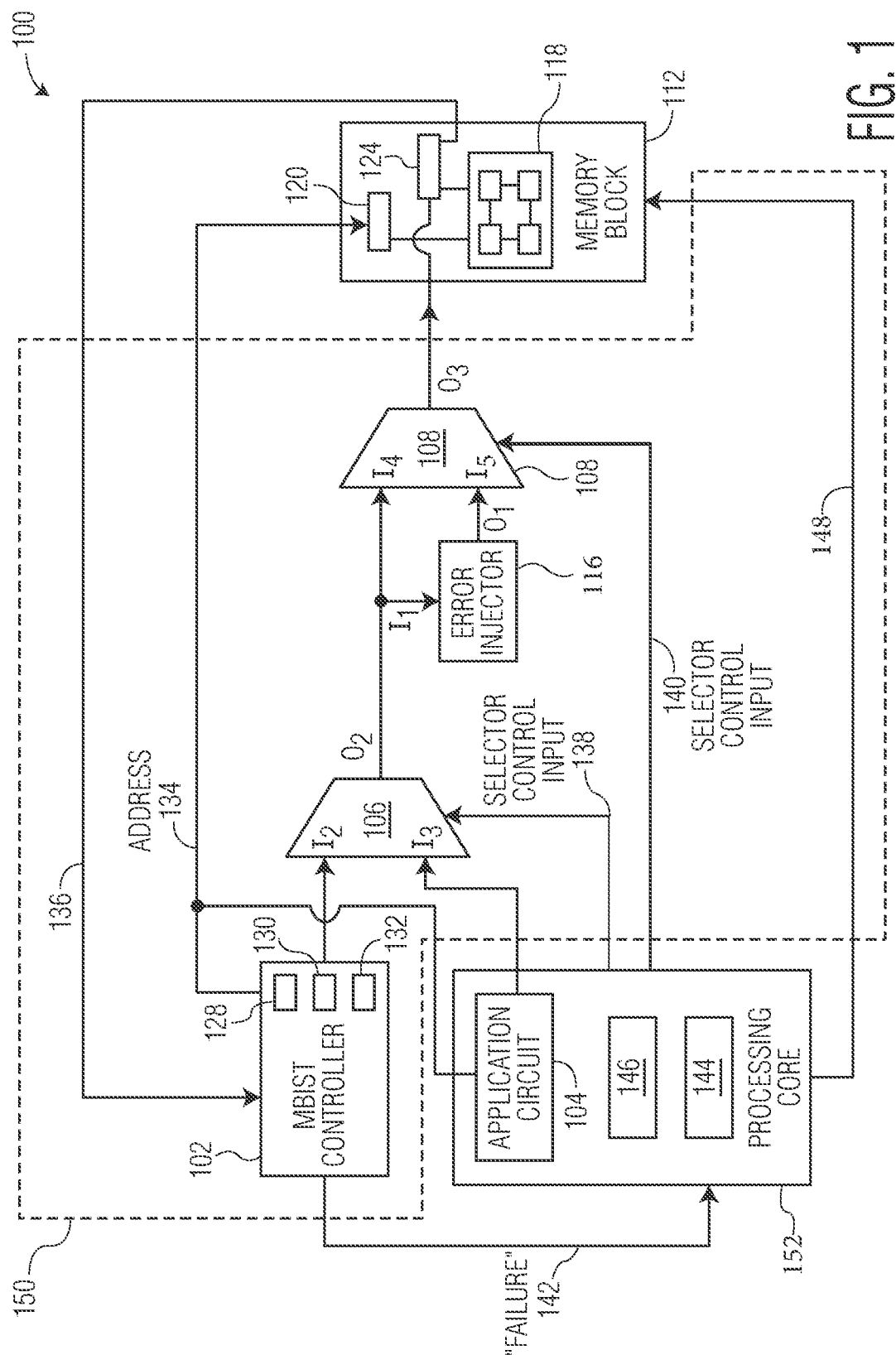
FIG. 1 illustrates a system for validating diagnostic action software that implements a diagnostic action associated with failure of a memory built-in-memory test (BIST) in accordance with an embodiment.

The drawings are for the purpose of illustrating example embodiments, but it is understood that the embodiments are not limited to the arrangements and instrumentality shown in the drawings.

DETAILED DESCRIPTION

The detailed description of the appended drawings is intended as a description of the various embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

A built-in-self test (BIST) is used to determine whether a circuit in an electronic system is defective. In an example, a memory BIST (MBIST) is used to determine whether a circuit in a form of a memory block is defective. The MBIST is circuitry in the electronic system that runs memory algorithms to verify memory functionality and identify memory faults. The MBIST circuit excites the memory block to check degradation of silicon with aging and allow for detecting memory failures. The MBIST circuit typically writes a bit pattern to the memory block and then reads a bit pattern stored in the memory block. If the bit patterns written and read match, then the memory block does not have a storage fault but if the patterns do not match, the memory block has a storage fault.

The memory block is typically used by an application circuit in or associated with a processing core of the electronic system. The application circuit executes a software application to cause application data to be stored in the memory block during normal operation in contrast to the MBIST circuit storing the pattern in the memory as part of the MBIST. A selector at an input to the memory block typically selects whether the pattern from the MBIST circuit is to be written to the memory block or the application data which is received from the application circuit is to be stored in the memory block. Errors could also be injected in the application data stored by the application circuit to check error recovery of the software application such as execution of error check and correction (ECC), but the errors are not arranged be injected during the MBIST to test the memory block.

Embodiments disclosed herein are directed to injecting errors during MBIST to validate diagnostic action software which implements a diagnostic action when the MBIST fails or when the application circuit outputs application data to validate error recovery in application software. An output of an MBIST controller of an MBIST circuit and the application circuit of a processing core are coupled to respective inputs of a first selector. The first selector allows for selection by a first selection signal of an output of the MBIST controller or application circuit. Further, the output of the first selector is coupled to an input of a second selector and an error injector. The error injector adds an error to the output of the first selector. In an example, the error might be to flip one or more bits of an output of the MBIST controller or output of the application circuit. An output of the error injector is coupled to an input of the second selector. The second selector has a second signal to allow for selection of the output of the error injector or the output from the first selector for output by the second selector. Data which is output by the second selector is stored in the memory block. If the first selector and second selector are configured to store data output by the application circuit with errors injected, then the application circuit then reads the data stored in the memory and determines whether error recovery of the application circuit is able to correct errors in the data read. The application circuit is able to verify operation of the error recovery. If the first selector and second selector are configured to store data output by the MBIST controller with error injected, then the MBIST controller then reads the data stored in the memory block. Because the data stored and received are different because of the error injection, the MBIST circuit outputs an indication that the memory block has a storage fault even though the memory block might not have a storage fault since the error in the read data was introduced not by a storage fault in the memory block but by the error injection. The processing core receives the indication of failure from the MBIST circuit and then performs a diagnostic action based on execution of the diagnostic action software. The processing core monitors this diagnostic action to validate operation of the diagnostic action software. Proper operation of the diagnostic action software results in improved reliability of the electronic system in the presence of failure of the MBIST. In some examples, the first and second signal of the respective first and second selector are configured to store data output by the MBIST controller or application circuit without any error injection. The error injection for MBIST and error recovery testing becomes a mutually exclusive process and any diagnostic action or error recovery is able to be validated even though the memory block is not defective. Well known instructions, protocols, structures, and techniques have not been shown in detail in order not to obfuscate the description.

Example Systems

FIG. 1 illustrates a system 100 for validating diagnostic action software that implements a diagnostic action associated with failure of a memory built-in-memory test (MBIST) in accordance with an embodiment. The system has a memory block 112 and an MBIST circuit 150 which includes an MBIST controller 102 and an error injector 116. In an example, the system 100 and components thereof may be implemented by one or more of analog circuitry, mix signal circuitry, memory circuitry, logic circuitry, and processing circuitry that executes code that when executed by the processing circuitry performs the disclosed functions, among other implementations. The system 100 may be embedded in an electronic system (not shown) such as an automotive system, an aircraft guidance system, a home security system, among other systems. The memory block 112 may be a semiconductor device which stores data. In an example, the memory block 112 may be random access memory (RAM), tightly coupled memory (TCM), dynamic RAM, or static RAM, among other types. The memory block 112 consists of a plurality of memory cells 118 which in an example is connected in an array structure, such as a two-dimensional array having rows of memory cells and columns of memory cells. In an example, the stored data may be one or more bits and each memory cell of the plurality of memory cells 118 may store the one or more bits of the data. The memory cell may be addressable by an address provided to an address bus 120 coupled to the plurality of memory cells 118 to read a bit from or write a bit to a memory cell. In an example, an address on the address bus 120 may identify the memory cell by a row and column of the plurality of memory cells 118. The memory block 112 may also have a data bus 124 to receive data to store in the memory block 112 or output data which is stored in the memory block 112. During a write operation, data received on the data bus 124 is stored in a memory cell of the plurality of memory cells 118 indicated by an address on the address bus 120. During a read operation, data is output on the data bus 124 which corresponds to the data stored in a memory cell of the plurality of memory cells 118 indicated by an address on the address bus 120.

The MBIST controller 102 is used to determine whether a memory cell in the memory block 112 has a storage fault. The MBIST controller 102 executes memory algorithms to verify memory functionality and identify storage faults in the plurality of memory cells 118. The MBIST controller 102 may control whether an MBIST operation is performed and includes an address generator 128, a data generator 130, and a comparator 132. The address generator 128 generates an address to store data in the memory block 112. The data generator 130 may generate data which in an example is a test pattern such a bit pattern of one or more bits which is output by the MBIST controller 102 as one or more bits. The MBIST controller 102 may generate the address to store the test pattern in the memory block 112 at the address. The address generator 128 may also generate the address to retrieve the data stored in the memory block 112 at the address. In an example, the MBIST controller 102 may store in a register the test pattern. The comparator 132 may compare the data which was stored to the memory block 112 and is in the register to what was retrieved from the memory block 112 Any differences in bits would typically indicate a storage fault in a memory cell of the memory block 112. In an example, the data output by the MBIST controller 102 may be a data signal and the address output by the MBIST circuit 102 may be an address signal. The address may be provided from the MBIST controller 102 to the memory block 112 by an address line 134 to the address bus 120 to indicate the location where data on the data bus 124 of the memory block 120 is to be stored in the memory block 112. The address line 134 and other lines has disclosed herein may be a communication path for carrying signals from one circuit to another circuit in the system 100 such as communication bus such as but not limited to a microcontroller bus, a high-performance bus, a peripheral bus, or an extensible interface bus.

The error injector 116 may insert errors in the data stored in the memory block 112. The error injector 116 may have an input I1 and an output O1. Data may be received at the input and the error injector 116 may add an error to the data. The data with the error may be provided to the output of the error injector 116. In an example, the data input may be a bitstream and the error injector may flip one or more predetermined bits in the bitstream to create an errored bitstream which is then output by the error injector 116.

In some examples, the system 100 may include a processing core 152 which is external to the MBIST circuit 150. The processing core 152 may be a circuit with a processor 146 to facilitate performing various functions such as automotive functions, aircraft guidance functions, home security functions, among other functions of the electronic system and not any functions associated with MBIST during design for test (DFT) of the memory block 112. The processing core 152 may be operable in the field, e.g., by an end user of the electronic system or system integrator, and configured to perform functions other than testing operation of the memory block 112 during manufacture of the memory block 112. In an example, the processing core 152 may have an application circuit 104 to perform these functions. The application circuit 104 is shown to be integrated in the processing core 152 but in other examples may be external to the processing core 152. In an example, the application circuit 104 may include a processor (not shown) which executes application software that uses the memory block 112 to store data to perform various functions for the electronic system. The application circuit 104 may generate the data to be stored in the memory block 112 during normal operation of the application circuit 104. The application circuit 104 may also generate an address where the data is to be stored in the memory block 112. The address may be provided to the address bus 124 of the memory block 112 via the address line 134 to indicate the location where the data is to be stored in the memory block 112. In an example, the data output by the application circuit 104 may be a data signal and the address output by the application circuit 104 may be an address signal.

The MBIST circuit 150 further has a first selector 106, and a second selector 108. The first selector 106 and second selector 108 may each have two inputs I2, I3 and I4, I5 respectively and one output O2 and O3 respectively. Further, the selectors 106, 108 may have a respective selector control input 138, 140. Based on an indication on a selector control input, a signal on one of the two inputs is selected for output for a selector. For example, if the indication is a first indication, then the signal on a first input may be output by a selector. As another example, if the indication is a second indication, then a signal on a second input may be output by the selector. In an example, the processing core 152 may provide a selection signal to the selector control input to select which of the signals on the two inputs of a selector is output depending on a mode of operation of the memory system. Further, the first input of the first selector 106 may be coupled to the output of MBIST controller 102 and an output from the application circuit 104 may be coupled to the second input of the first selector 106. The output of the first selector 106 may be coupled to the first input of the second selector 108 and the input of the error injector 116. The output of the second selector 108 may be coupled to the data bus 124 of memory block 112.

Certain embodiments are directed to the system 100 validating diagnostic action software that implements a diagnostic action in response to an indication of failure of a MBIST by the MBIST controller 102 to the processing core 152. In an example, the system 100 operates in multiple modes to test operation of the memory block 112, which is a necessary feature in system-on-a chip design and testing. The system 100 may be arranged to one of perform a MBIST, allow the application circuit 104 to store data in the memory block 112, and inject errors in the data stored by the application circuit 104 or during the MBIST to simulate a storage fault in the memory block 112 even though the memory block 112 does not have such a storage fault. A fault may be that the memory cell is aged due to silicon degradation or aging of the memory cell and other reasons such that the memory cell corrupts data stored in the memory cell. Presence of the error causes the MBIST controller 102 to output an indication of failure in the MBIST to the processing core 152 via line 142. In an example, the MBIST circuit may disable any mechanism to reconfigure the memory block in response to detecting the error resulting in the failure indication. The processing core 152 may perform a diagnostic action which may take many forms in response to the indication of failure of the MBIST from the MBIST controller after the MBIST is completed. In an example, the diagnostic action may be implemented by diagnostic action software 144 executed by the processing core 152 to reconfigure the memory block. The diagnostic action may be an action which is performed to diagnosis and remedy the error even though in some examples the memory block may not have a fault. For example, if the memory block is configured as tightly coupled memory (TCM) which has an error, the diagnostic action may identify and disable the memory cell in the TCM so that the electronic system in which system 100 is located may use another type of memory such as system memory instead of the TCM to store data. In an another example, if the memory block 112 is a static random access memory (SRAM), then the diagnostic action may identify the failing memory bock and reduce size of the SRAM available to the electronic system and the faulty memory cells are not used for storage. In yet another example, if the memory block 112 is repairable memory, then the diagnostic action may cause a reconfiguration of the memory such as identifying and diverting access to a faulty memory cell to a redundant memory cell in the memory block 112 which is not faulty. In another example, a message buffer which stores a message from a circuit and has a storage fault may be identified and replaced with another message buffer which is not defective. The diagnostic action may take other forms as well. The processing core 152 which is coupled to the memory block 120 via line 148 may then verify that the diagnostic action is performed in presence of the error such as analyzing the memory block 112 for a signature that would indicate that the diagnostic action was properly performed. The error injection allows for verifying operation of the diagnostic action software which implements the diagnostic action by simulating a storage fault when the memory block 112 is not actually faulty to cause the diagnostic action to be performed and verified when the MBIST fails. Further, unlike a DFT, the MBIST failure is reported outside of the MBIST circuit and allows for testing the implementation of the diagnostic action software which is executed in the processing core of the electronic system, in response to the indication of MBIST failure outside of the MBIST circuit. In other examples, the error is injected into the data output by the application circuit 104 so the application circuit 104 may verify whether an implementation of error recovery that is performed is faulty. The error injection allows for simulating a fault when the memory block 112 is not actually faulty to cause the error recovery to be performed and verified. In an example, the fault may simulate a fault due to electromagnetic interference in the memory block 112. Advantageously, the diagnostic action software and error recovery may be validated when a system integrator which implements the diagnostic action software or error recovery might not otherwise have access to a faulty memory block 112 to test the implementation.

The system 100 may operate in one of a plurality of modes. The mode may be controlled by the processing core 152 which is coupled to one or more of the first selector 106 and second selector 108 which is set to control whether data from the MBIST controller 102 or application circuit 104 is stored in the memory block 112 and whether or not an error is injected in the data by the error injector circuit 116.

In a first mode, the application circuit 104 may store data in the memory block 112. The application circuit 104 may output data and an address on the address line 134. The first selector 106 may receive the output data at the second input. The processing core 152 may provide a selector signal to the respective selector inputs of the selectors 106, 108 to cause the data of the application circuit 104 to be stored in the memory block 112 at the address indicated on the address line 134. A selector signal of the first selector 106 may be set to select the second input. Based on the selection, the first selector 106 may output the data from the application circuit 104. The output of the first selector 106 is received at the first input of the second selector 108. The selector signal of the second selector 108 may be set to select the first input. The data output by the application circuit 104 is provided to the data bus 124 and stored in the memory block 112 at the address indicated by the application circuit 104.

In a second mode, the MBIST controller 102 may store data in the memory block 112. The MBIST controller 102 may output data generated by the data generator 130 such as a test pattern and an address generated by the address generator 128 on the address line 134. The first selector 106 may receive the data at the first input. The processing core 152 may provide a selector signal to the respective selector control inputs of the selectors 106, 108 to allow the MBIST circuit 150 to store the data in the memory block 112. The selector signal of the first selector 106 may be set to select the first input. Based on this setting, the first selector 106 may output the data from the MBIST controller 102 which is received at the first input of the second selector 108. The selector signal of the second selector 108 may be set to select the first input which results in the data from the MBIST controller 102 to be stored at the address in the memory block 112 indicated by the MBIST controller 102 on the address line 134. The memory block 112 may be further arranged to output the data which was stored in the memory block 112 to the MBIST controller 102 via line 136 which then compares using the comparator 132 the data which was sent to be stored in the memory block 112 and the data which was received from the memory block 112. Any difference in the data would indicate that the memory block 112 introduced an error in the data and a memory cell in the memory block 112 is faulty. The MBIST controller 102 may detect the error and output an indication of failure of the MBIST to the processing core 152 which performs a diagnostic action by executing the diagnostic action software.

In a third mode, the MBIST controller 102 may output data for storage in the memory block 112 but an error may be introduced in the data to verify a diagnostic action is performed resulting from the error. The MBIST controller 102 may output data such as a test pattern and an address to store the data in the memory block 112. The processing core 152 may provide a selector signal to the respective selector control inputs of the selectors 106, 108 to allow the MBIST controller 102 to store the data output by the MBIST controller 102 in the memory block 112 with injected errors. The first selector 106 may receive the data output from the MBIST controller 102 at the first input. The selector signal of the first selector 106 may be set to select the first input. The first selector 106 may output the data from the MBIST controller 102 which is received at the first input of the second selector 108 and the error injector 116. The selector signal of the second selector 108 may be set to select the second input which results in the output of the error injector 116 which injects errors in the data from the MBIST controller 102 being output by the second selector 108. The errored data may be then stored in the memory block 112 at the address indicated by the MBIST controller 102. The memory block 112 may be further arranged to output the data which was stored to the MBIST controller 102 which then is compared by the comparator 132 to the data which was output to be stored in the memory block 112. The difference in the data would indicate that an error was introduced in the data. In an example, the MBIST circuit may disable any mechanism to reconfigure the memory block in response to detecting the error resulting in the failure indication. Presence of the error causes the MBIST controller 102 to output an indication of failure in the MBIST on line 142 after the MBIST is completed. The processing core 152 may then perform a diagnostic action via the diagnostic action software 144, examples of which were described above in response to receiving the failure indication from the MBIST controller 102. The diagnostic action software may be typically implemented not by a manufacturer of the memory block 112 but a system integrator in an example which uses the memory block 112 in the electronic system. The diagnostic action software needs to be validated for correct operation. Because the error was introduced in the data output by the MBIST controller 102, the processing core 152 may verify that a proper diagnostic action was performed even though the memory block 112 is not faulty since the error was introduced for specific bits by the error injector 116. The processing core 152 may be configured store an indication of what the diagnostic action should be which is then verified to verify operation of the diagnostic action software. The verification may comprise analyzing the memory block 112 or other memory of the electronic system for the indication to determine whether the diagnostic action was performed such as redirecting storage of data to the memory cell which is faulty to another memory cell. In an example, the indication may be in a mapping table in the memory block 112 which indicates a memory cell at an address has a storage fault and is replaced with another memory cell. This mapping table may be generated by the diagnostic action software. In an example, when an address is provided to the memory block 112 to store data in the memory cell with the storage fault, the memory block 112 may use the mapping table to store the data in the memory cell which replaces the memory cell with the storage fault. If the mapping table has an entry for the address where the data was stored, then the diagnostic action software may be validated in an example. If the mapping table does not have an entry for the address where the data was stored, then the diagnostic action software may not be validated in an example.

In a fourth mode, the application circuit 104 may store data in the memory block 112 and an error may be introduced in the data to verify an error recovery performed by the application circuit 104 resulting from the error. The application circuit 104 may output data and an address to store the data in the memory block 112. The first selector 106 may receive the output data at the second input. The processing core 152 may provide a selector signal to the respective selector control inputs of the selectors 106, 108 to allow the application circuit 104 to inject errors in the data output by the application circuit 104. The selector signal of the first selector 106 may be set to select the second input. The first selector 106 may output the data from the application circuit 104 which is received at the first input of the second selector 108 and the error injector 116. The selector signal of the second selector 108 may be set to select the second input which is output by the second selector 108. The second input which is output may be the errored data based on the error injector 116 injecting an error in the data output by the application circuit 104. The data with the error may be then provided to the data bus 124 and stored in the memory block 112 at the address output by the application circuit 104 on the address line 134. The memory block 112 may be further arranged to output the data which was stored to the application circuit 104. The application circuit 104 may perform an error recovery on the data with the error such as ECC to correct the errors and the corrected data is then compared to the data which was sent by the application circuit 104 to be stored. Any difference in the data would indicate to the application circuit 104 that the error recovery performed by the application circuit 104 is faulty.

Figure 2:
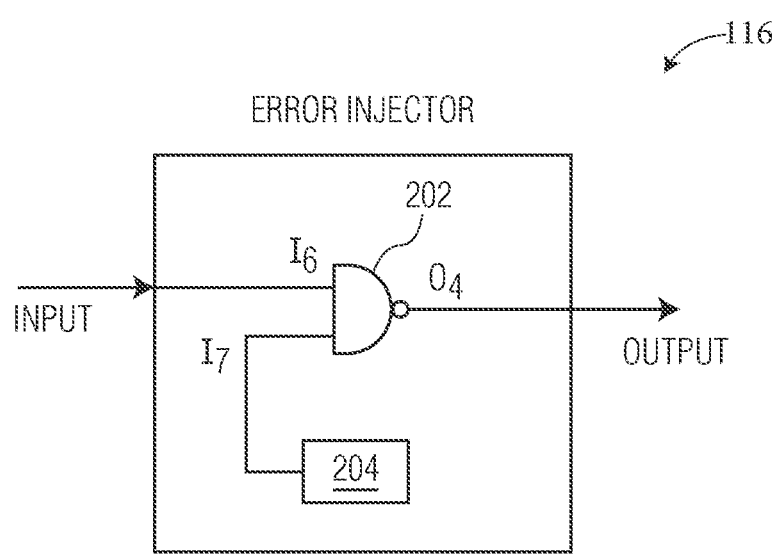
FIG. 2 is a block diagram of an example error injector in accordance with an embodiment.
Figure 3A:
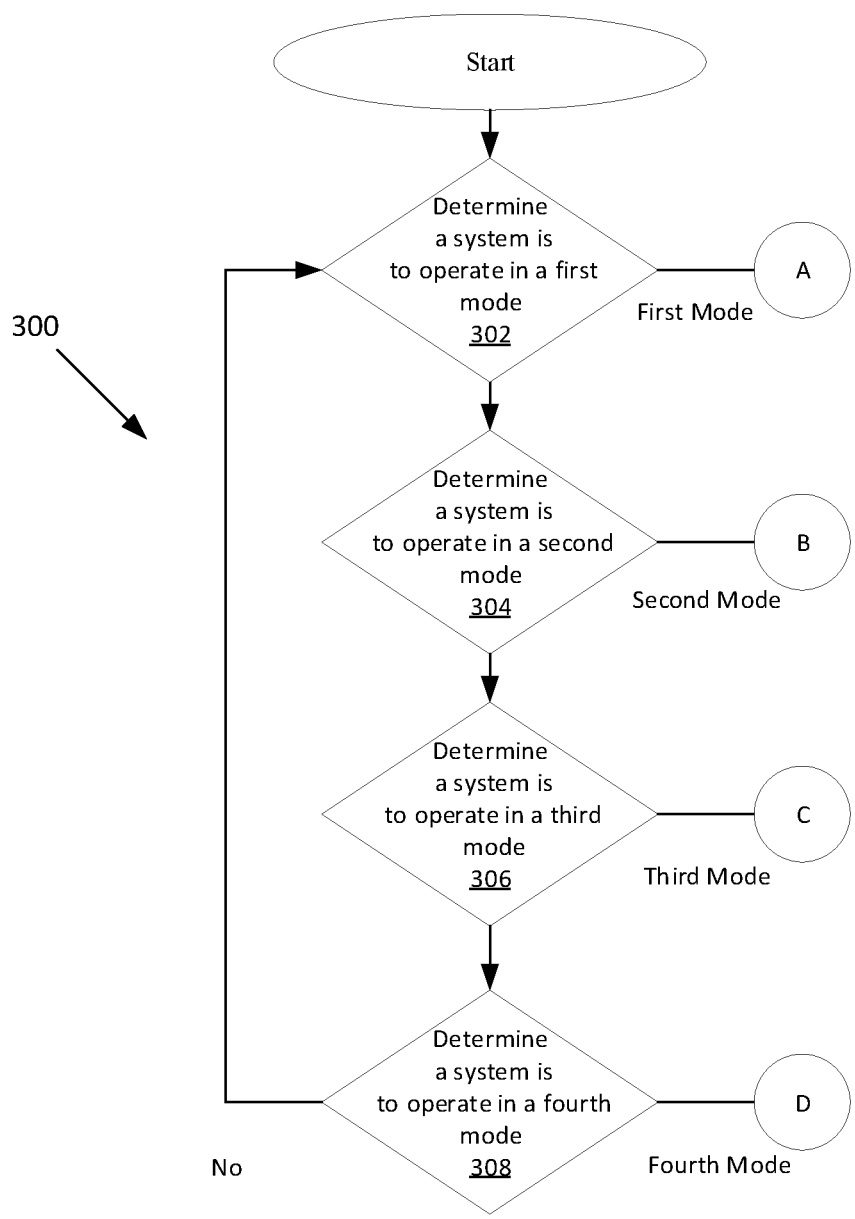
FIG. 3A-3E illustrate a flow chart of functions associated with operation of the system in accordance with an embodiment.
Figure 3B:
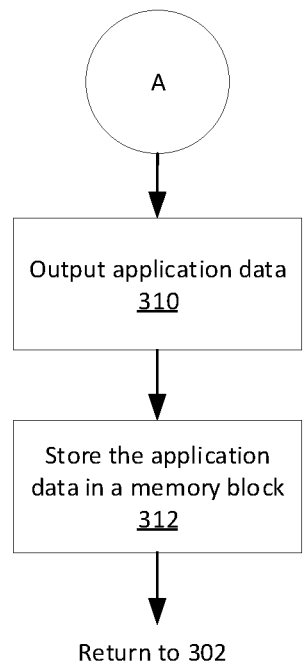
Figure 3C:
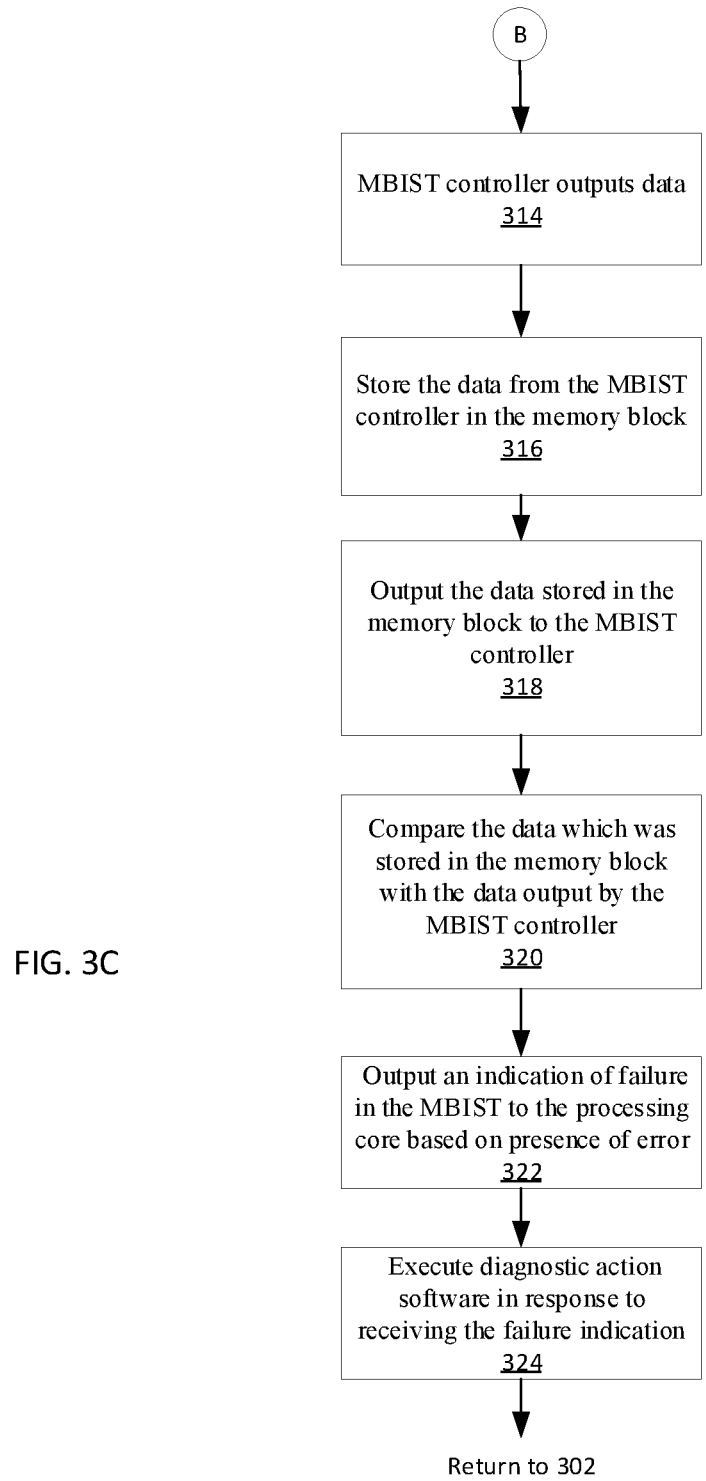
Figure 3D:
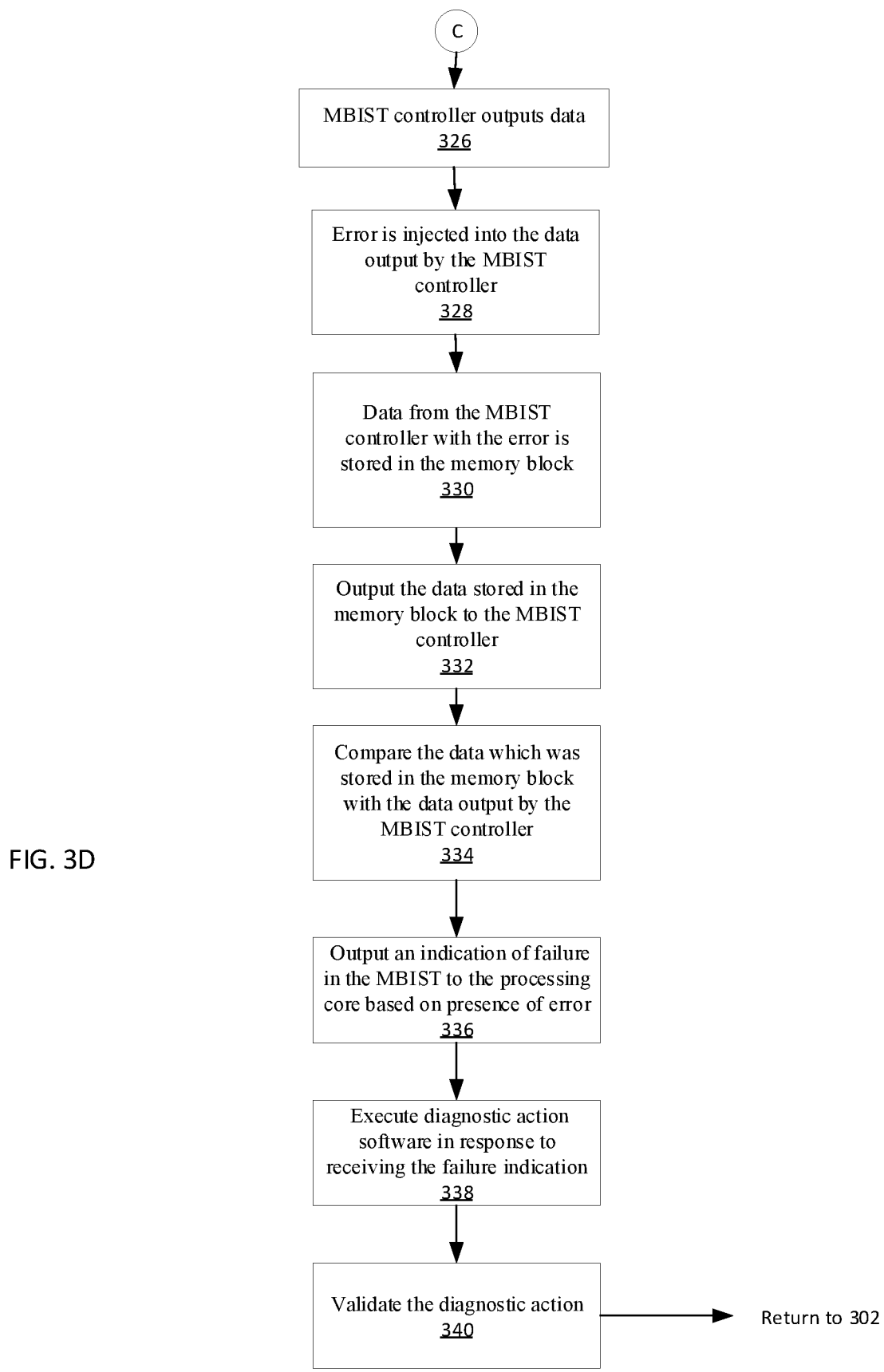
Figure 3E:
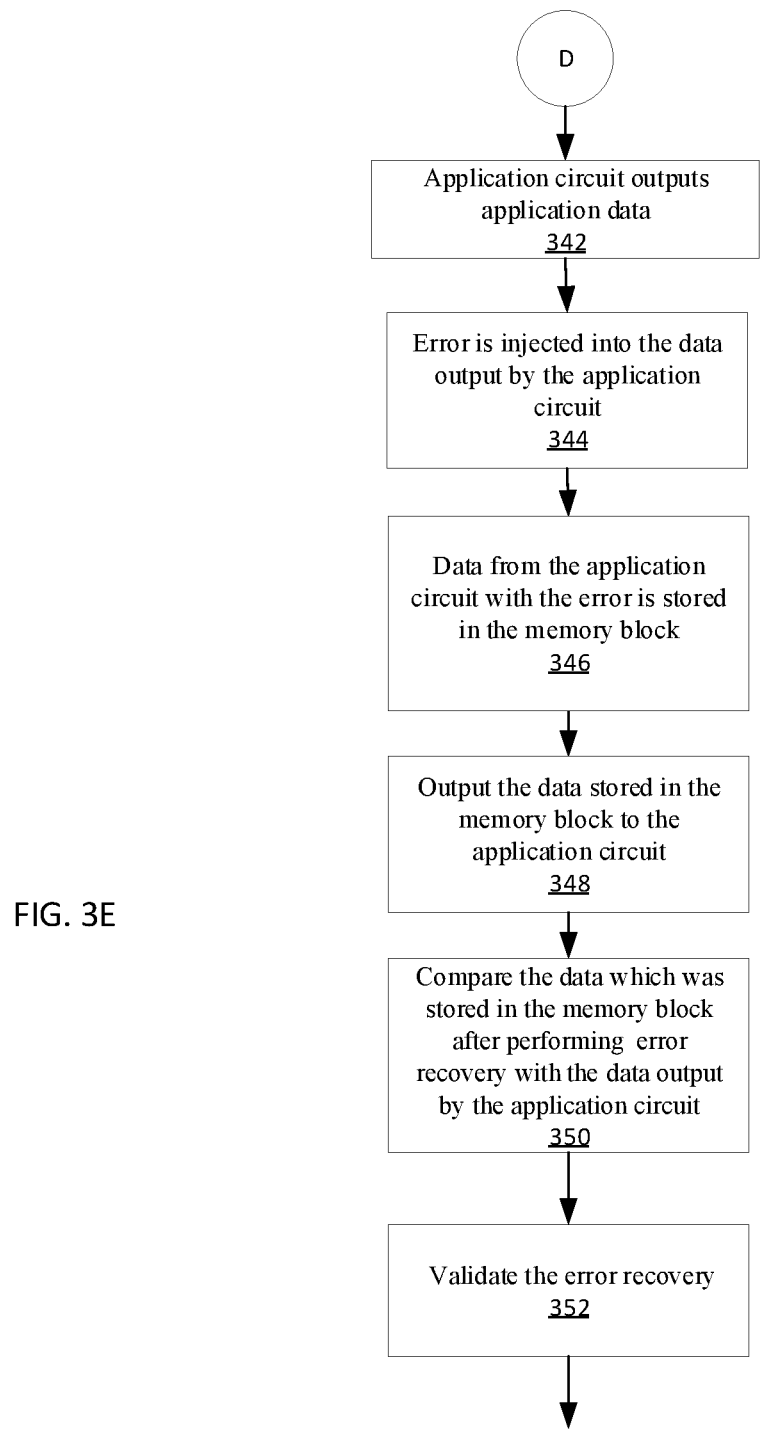

FIG. 2 is a block diagram of the example error injector 116 in accordance with an embodiment. The error injector 116 may have an input I1 and an output O1. The input of the error injector 116 may be coupled to an NAND gate 202. The NAND gate 202 may have a first input I6 and a second input I7 and an output O4. The input to the error injector 116 may be coupled to the first input I6. A bit generator 204 may be coupled to the second input I7. The bit generator 204 may generate a "1" or "0" bit as a function of time. In an example, the bit generator 204 may generate a predetermined sequence of bits. The output of the NAND gate 202 may be a logic AND of each bit of data on the input of the error injector 116 and a corresponding bit output by the bit generator 204 followed by an inversion of the logic AND. The logic operation results in changing one or more bits of the input to the error injector 116 in a predetermined manner which is then provided to the output of the error injector 116. The data output by the error injector 116 simulates a fault in the memory block 112. The MBIST circuit 102 or application circuit 104 detects this error and the diagnostic action or error recovery, respectively, is performed in response to the error. The processing core 152 may then verify operation of the diagnostic action or error recovery associated with the detected error even though the memory block 112 may not be faulty. The predetermined error injection causes a known diagnostic action or error recovery associated with the error to be compared to the diagnostic action or error recovery actually performed to verify the diagnostic action or error recovery.

The error injection is performed using a logic operation in the form of a NAND gate. The logic operation may take other forms including OR, AND, and other combinations in other examples.

Example Methods

FIGS. 3A-3E illustrate a flow chart 300 of functions associated with operation of the system 100 in accordance with an embodiment. The functions may be performed by the system 100 and vary depending on a mode of operation of the system 100.

A determination is made of a mode in which the system 100 is to operate. The mode may include a first mode when errors are not injected in the data output by the application circuit 104, a second mode when errors are not injected in the data output by the MBIST controller 102, a third mode when errors are injected in the data output by the MBIST controller 102, and an a fourth mode when errors are injected in the data output by the application circuit 104. Based on the mode of operation, respective functions associated with the mode may be performed.

At 302, a determination is made whether a system is to operate in the first mode. If the system 100 is to operate in a first mode where application data from an application circuit 104 is to be stored in a memory block 112 without error injection, then at 310 the application circuit outputs application data. At 312, the system 100 causes the application data to be stored in the memory block and processing returns to 302.

At 304, a determination is made whether a system is to operate in the second mode. If the system 100 is to operate in a second mode where a MBIST is be performed without error injection, then at 314 the MBIST controller 102 outputs data. In an example, the data output is a test pattern which is one or more bits. At 316, the data from the MBIST controller 102 is stored in the memory block. At 318, the data stored is output from the memory block 112 to the MBIST controller 102. At 320, the MBIST controller 102 compares the data which was stored in the memory block 112 with the data output by the MBIST controller 102. At 322, presence of an error causes the MBIST controller 102 to output an indication of failure in the MBIST to the processing core 152. The indicative of failure indicates a storage fault in the memory block 112. At 324, the processing core 152 executes diagnostic action software to perform a diagnostic action in response to receiving the failure indication. If there is no error, then the memory block 112 is operating correctly and the MBIST controller 102 does not indicate any failure indication. Processing returns back to 302.

At 306, a determination is made whether a system is to operate in the third mode. If the system 100 is to operate in a third mode where data from the MBIST controller 102 is to be stored in the memory block 112 with error injection, then at 326 the MBIST controller 102 outputs data. In an example, the data output is a test pattern which is one or more bits. At 328, an error is injected into the data output by the MBIST controller 102. At 330, the data from the MBIST controller 102 with the error is stored in the memory block 112. The difference in the data output by the MBIST controller 102 and the data stored in the memory block 112 simulates that a memory cell in the memory block 112 is faulty. At 332, the data stored is output from the memory block 112 to the MBIST controller 102. At 334, the MBIST controller 102 compares the data which was stored in the memory block 112 with the data output by the MBIST controller 102. At 336 the MBIST controller 102 outputs an indication of failure in storage after the MBIST is completed because the data output by the memory block 112 is different than the data output by the MBIST controller 102. In an example, the MBIST circuit 150 may disable any mechanism to reconfigure the memory block in response to detecting the error resulting in the failure indication. At 338, the processing core 152 may then execute diagnostic action software to perform a diagnostic action in response to receiving the failure indication and at 340 the processing core 152 validates the diagnostic action performed. An indication associated with the validation is output and processing returns back to 302. The validation may comprise determining whether the diagnostic action performed matches an expected diagnostic action. The validation may be successful if the diagnostic action performed matches the expected diagnostic action and not successful if the diagnostic action performed does not match the expected diagnostic action. If the diagnostic action is not validated, then the diagnostic action software may be faulty.

At 308, a determination is made whether a system is to operate in the fourth mode. If the system 100 is to operate in a fourth mode where data from an application circuit 104 is to be stored in a memory block 112 with error injection, then at 342 the application circuit 104 outputs application data. At 344, an error is injected into the data output by the application circuit 104. At 346, the errored data is stored in the memory block 112. The difference in the data output by the application circuit 102 and the data stored in the memory block 112 simulates that a memory cell in the memory block 112 has a storage fault. At 348, the data stored in the memory block 112 is output from the memory block 112 to the application circuit 104. The application circuit 104 performs error recovery such as ECC on the data output from the memory block 112. At 350, the application circuit 104 compares the data after the error recovery with the data output by the application circuit 104. At 352, a validation of the error recovery is performed. If there is no difference, then the error recovery in the application circuit 104 correctly operates and the validation is successful. If there is a difference, then the error recovery in the application circuit 104 fails and the validation is not successful which indicates that the error recovery executed by the application circuit 104 is faulty. Processing returns back to 302.

In an example, BIST other than MBIST may be performed to validate a diagnostic action associated with the BIST. The disclosed embodiments may not be limited to the MBIST operations.

In one example, a method for validating implementation of a diagnostic action is disclosed. The method comprises: outputting first data by a memory built in self test (MBIST) controller in an MBIST circuit; injecting one or more errors in the first data to produce second data; storing the second data in the memory block; outputting, by the memory block, the second data stored in the memory block; receiving by the MBIST controller the second data; detecting an error in the second data based on a comparison with the first data, the error indicative of a failure of the MBIST, wherein the memory block is not reconfigured by the MBIST circuit in response to the detected error; outputting by the MBIST controller an indication of failure of the MBIST to a processing core after the MBIST is completed and in response to the detected error, wherein the processing core is external to the MBIST circuit; performing, by the processing core, the diagnostic action to reconfigure the memory block in response to receiving the indication of failure of the MBIST; and validating the implementation in the processing core of the diagnostic action in response to the failure of the MBIST. In an example, the method further comprises outputting by an application circuit third data to be stored in a memory block; injecting error in the third data to produce fourth data; storing the fourth data in the memory block; outputting, by the memory block, the fourth data stored in the memory block; receiving by the application circuit the fourth data; detecting an error in the fourth data based on a comparison with the third data; performing an error recovery based on the detection of the error in the fourth data; and verifying that the error in the fourth data is corrected. In an example, detecting the error comprises determining whether the first data output by the application circuit and the second data received from the memory block are the same. In an example, the memory block does not have any storage faults.

In another embodiment, a system is disclosed. The system comprises a MBIST controller having an input and an output; a first selector having a first input, a second input; and an output; a second selector having a first input, a second input; and an output; an error injector having an input and an output; a memory block having an input and an output; and wherein the output of the MBIST controller is coupled to the first input of the first selector; the output of the first selector is coupled to the first input of the second selector; the output of the second selector is coupled to the input of the memory block; the output of the memory block is coupled the input of the MBIST controller; the input of the error injector is coupled to the output of the first selector; and the output of the error injector is coupled to the second input of the second selector. In an example, the system further comprises an application circuit comprising an input and an output; wherein the output of the application circuit is coupled to the second input of the first selector. In an example, the first selector is configured to output first data from the second input of the first selector, the second input of the first selector arranged to receive data output by the application circuit; the second selector is configured to output second data from the second input of the second selector for storage in the memory block, the second data being the first data with one or more errors injected by the error injector. In an example, the application circuit is arranged to detect an error in the first data based on a comparison of the first data and the second data stored by the memory block; perform an error recovery based on the detected error to generate corrected data; and verify the error recovery by comparing the first data with the corrected data. In an example, the first selector is configured to output first data from the first input of the first selector, the first input of the first selector arranged to receive data output by the MBIST controller; the second selector is configured to output second data from the second input of the second selector for storage in the memory block, the second data being the first data with one or more errors injected by the error injector. In an example, the MBIST controller is arranged to detect an error in the first data based on a comparison of the first data and the second data; and the processing core is arranged to perform a diagnostic action in response to receiving the indication of failure of the MBIST and validate the diagnostic action. In an example, the memory block does not have any storage faults. In an example, the error injector comprises an NAND gate, a first input of the NAND gate coupled to an bit generator, a second input of the NAND gate coupled to the output of the first selector, and an output of the NAND gate coupled to the output of the error injector.

In yet another embodiment, a system is for validating implementation of a diagnostic action is disclosed. The system is arranged to output by a memory built in self test (MBIST) controller in a MBIST circuit first data to be stored in a memory block; inject one or more errors in the first data to produce second data; store the second data in the memory block; output the second data stored in the memory block; receive by the MBIST controller the second data; detect an error in the second data based on a comparison with the first data, wherein the memory block is not reconfigured by the MBIST circuit in response to the detected error; output by the MBIST controller an indication of failure of the MBIST to a processing core after the MBIST is completed, wherein the processing core is external to the MBIST circuit; perform the diagnostic action to reconfigure the memory block in response to receiving the indication of failure of the MBIST; and validate the implementation in the processing core of the diagnostic action in response to the failure of the MBIST. In an example, the system is arranged to output by an application circuit third data to be stored in a memory block; inject error in the third data to produce fourth data; store the fourth data in the memory block; output the fourth data stored in the memory block; receive by the application circuit the fourth data; detect an error in the fourth data based on a comparison with the third data; perform an error recovery based on the detection of the error; and verify that the error in the fourth data is corrected. In an example, the error recovery is an error check and correction. In an example, the system is arranged to detect the error comprises determining whether the first data output by the application circuit and the second data received from the memory block are the same. In an example, the memory block does not have any storage faults. In an example, diagnostic software which implements the diagnostic action is faulty based on the diagnostic action not being validated. In an example, the memory block is repairable memory and the diagnostic action comprises repairing the memory block. In an example, diagnostic action comprises redirecting data stored in a memory cell of the memory block to another memory cell of the memory block.

A few implementations have been described in detail above, and various modifications are possible. The disclosed subject matter, including the functional operations described in this specification, can be implemented in electronic circuit, computer hardware, firmware, software, or in combinations of them, such as the structural means disclosed in this specification and structural equivalents thereof: including potentially a program operable to cause one or more data processing apparatus such as a processor to perform the operations described (such as a program encoded in a non-transitory computer-readable medium, which can be a memory device, a storage device, a machine-readable storage substrate, or other physical, machine readable medium, or a combination of one or more of them).

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

We claim:

1. A method for validating implementation of a diagnostic action, the method comprising:
   outputting first data by a memory built in self test (MBIST) controller in an MBIST circuit;
   injecting one or more errors in the first data to produce second data;
   storing the second data in the memory block;
   outputting, by the memory block, the second data stored in the memory block;
   receiving by the MBIST controller the second data;
   detecting an error in the second data based on a comparison with the first data, the error indicative of a failure of the MBIST, wherein the memory block is not reconfigured by the MBIST circuit in response to the detected error;
   outputting by the MBIST controller an indication of failure of the MBIST to a processing core after the MBIST is completed and in response to the detected error, wherein the processing core is external to the MBIST circuit;
   performing, by the processing core, the diagnostic action to reconfigure the memory block in response to receiving the indication of failure of the MBIST; and
   validating the implementation in the processing core of the diagnostic action in response to the failure of the MBIST.

2. The method of claim 1, further comprising outputting by an application circuit third data to be stored in a memory block; injecting error in the third data to produce fourth data; storing the fourth data in the memory block; outputting, by the memory block, the fourth data stored in the memory block; receiving by the application circuit the fourth data; detecting an error in the fourth data based on a comparison with the third data; performing an error recovery based on the detection of the error in the fourth data; and verifying that the error in the fourth data is corrected.

3. The method of claim 2, wherein detecting the error comprises determining whether the first data output by the application circuit and the second data received from the memory block are the same.

4. The method of claim 1, wherein the memory block does not have any storage faults.

5. A system comprising:
   a MBIST controller having an input and an output;
   a first selector having a first input, a second input and an output;
   a second selector having a first input, a second input and an output;
   an error injector having an input and an output;
   a memory block having an input and an output; and
      wherein the output of the MBIST controller is coupled to the first input of the first selector; the output of the first selector is coupled to the first input of the second selector; the output of the second selector is coupled to the input of the memory block; the output of the memory block is coupled the input of the MBIST controller; the input of the error injector is coupled to the output of the first selector; and the output of the error injector is coupled to the second input of the second selector.

6. The system of claim 5, further comprising an application circuit comprising an input and an output; wherein the output of the application circuit is coupled to the second input of the first selector.

7. The system of claim 6, wherein the first selector is configured to output first data from the second input of the first selector, the second input of the first selector arranged to receive data output by the application circuit; the second selector is configured to output second data from the second input of the second selector for storage in the memory block, the second data being the first data with one or more errors injected by the error injector.

8. The system of claim 7, wherein the application circuit is arranged to detect an error in the first data based on a comparison of the first data and the second data stored by the memory block; perform an error recovery based on the detected error to generate corrected data; and verify the error recovery by comparing the first data with the corrected data.

9. The system of claim 5, wherein the first selector is configured to output first data from the first input of the first selector, the first input of the first selector arranged to receive data output by the MBIST controller; the second selector is configured to output second data from the second input of the second selector for storage in the memory block, the second data being the first data with one or more errors injected by the error injector.

10. The system of claim 9, wherein the MBIST controller is arranged to detect an error in the first data based on a comparison of the first data and the second data; and the processing core is arranged to perform a diagnostic action in response to receiving the indication of failure of the MBIST and validate the diagnostic action.

11. The system of claim 5, wherein the memory block does not have any storage faults.

12. The system of claim 5, wherein the error injector comprises an NAND gate, a first input of the NAND gate coupled to an bit generator, a second input of the NAND gate coupled to the output of the first selector, and an output of the NAND gate coupled to the output of the error injector.

13. A system for validating implementation of a diagnostic action arranged to output by a memory built in self test (MBIST) controller in a MBIST circuit first data to be stored in a memory block; inject one or more errors in the first data to produce second data; store the second data in the memory block; output the second data stored in the memory block; receive by the MBIST controller the second data; detect an error in the second data based on a comparison with the first data, wherein the memory block is not reconfigured by the MBIST circuit in response to the detected error; output by the MBIST controller an indication of failure of the MBIST to a processing core after the MBIST is completed, wherein the processing core is external to the MBIST circuit; perform the diagnostic action to reconfigure the memory block in response to receiving the indication of failure of the MBIST; and validate the implementation in the processing core of the diagnostic action in response to the failure of the MBIST.

14. The system of claim 13, further comprising the system arranged to output by an application circuit third data to be stored in a memory block; inject error in the third data to produce fourth data; store the fourth data in the memory block; output the fourth data stored in the memory block; receive by the application circuit the fourth data; detect an error in the fourth data based on a comparison with the third data; perform an error recovery based on the detection of the error; and verify that the error in the fourth data is corrected.

15. The system of claim 14, wherein the error recovery is an error check and correction.

16. The system of claim 13, wherein the system arranged to detect the error comprises determining whether the first data output by the application circuit and the second data received from the memory block are the same.

17. The system of claim 13, wherein the memory block does not have any storage faults.

18. The system of claim 13, wherein diagnostic software which implements the diagnostic action is faulty based on the diagnostic action not being validated.

19. The system of claim 13, wherein the memory block is repairable memory and the diagnostic action comprises repairing the memory block.

20. The system of claim 13, wherein diagnostic action comprises redirecting data stored in a memory cell of the memory block to another memory cell of the memory block.

\* \* \* \* \*